United States Patent [19]

Dzwonczyk et al.

[11] Patent Number: 5,044,992
[45] Date of Patent: Sep. 3, 1991

[54] PRINTED CIRCUIT INJECTION MOLDED CONNECTOR WITH REMOVABLE BIFURCATED CONTACTS CAPABLE OF HIGH TEMPERATURE EXPOSURE

[75] Inventors: Luke Dzwonczyk, Marlborough; Richard Sullivan, Marshfield; William E. Wesolowski, Holden, all of Mass.; James W. Malloy, Valbonne, France

[73] Assignees: The Charles Stark Draper Laboratory, Cambridge; Raytheon Company, Lexington, both of Mass.

[21] Appl. No.: 424,522

[22] Filed: Oct. 20, 1989

[51] Int. Cl.⁵ .......................................... H01R 13/658
[52] U.S. Cl. .................................. 439/608; 439/931; 439/936
[58] Field of Search .............................. 439/55, 68-73, 439/525, 526, 86, 88, 90, 607, 608, 931, 936; 29/829, 830, 837, 843, 845, 848, 849, 883, 885

[56] References Cited

U.S. PATENT DOCUMENTS

| | | | |
|---|---|---|---|
| 3,605,075 | 9/1971 | Stofkooper | 439/931 |
| 3,845,453 | 10/1974 | Hemmer | 439/595 |
| 3,989,331 | 11/1976 | Hanlon | 439/70 |
| 4,075,759 | 2/1978 | Sochor | 29/845 |
| 4,155,321 | 5/1979 | Tamburro | 29/837 |
| 4,793,058 | 12/1988 | Venaleck | 29/845 |
| 4,902,235 | 2/1990 | Tonooka | 439/72 |

OTHER PUBLICATIONS

IBM Bulletin, Skinner, vol. 12, No. 3, p. 467, 8-1969.

Primary Examiner—Neil Abrams
Attorney, Agent, or Firm—Weingarten, Schurgin, Gagnebin & Hayes

[57] ABSTRACT

A connector protected against current pulses resulting from secondary emission from connector pins by a conductive layer surrounding each pin set. The conductive layer is intimately bonded to the connector insulation and is connected to the connector pin set. The connector is formed in a housing block of a liquid crystal thermoplastic that retains the crystal structure at elevated temperatures preventing deformation during high temperature soldering. The connector back and sides are patterned with plated conductors that provide interconnection between selected pins directly on the connector outer surfaces. The back surface of the connector is sealed by a heat setting acrylic that prevents contaminants from the environment at the back of the connector getting into the pin recesses.

19 Claims, 4 Drawing Sheets

PRINTED CIRCUIT INJECTION MOLDED CONNECTOR WITH REMOVABLE BIFURCATED CONTACTS CAPABLE OF HIGH TEMPERATURE EXPOSURE

BACKGROUND OF THE INVENTION

The present invention relates to electrical connectors used in hostile environments where radiation from the current carrying connector elements can build up potentially dangerous voltages on surrounding surfaces. In one example of the application of the invention in inertial guidance systems, there are many signals that must be carried through connectors that can be interrupted or impaired by potentials loose in the connector environment. The inertial guidance system is often exposed to particle radiation that can cause secondary emission of the negatively charged electrons from the connector pins. Their absence causes a positive charge on the pins which causes unwanted current. This current can disrupt the information carried by conductors of the connector pins. Connectors in other environments such as power plants are exposed to radiation that can produce emission from current carrying connector pins with the same deleterious effects.

In addition to the need to protect against voltage build up effects, connector bodies are subject to high temperatures during, for example, the vapor phase soldering of the connector pins to circuit boards that they are mounted to. The high temperatures can cause the plastic connector housing to thermally deform. Such change in physical shape can lead to the connector being unable to mate with corresponding connectors of the opposite gender.

In sensitive instrument applications where they are intended to be used in hostile environments, it is common to spray or vacuum deposit the assembly of instruments with protective coatings such as Union Carbide's Parylene. The coating can work its way into the connector housing and to the connector pins where it can prevent electrical contact from being made.

BRIEF SUMMARY OF THE INVENTION

The present invention provides a connector assembly in which the problem of voltage build up from secondary emission is solved by providing a conductive layer on the insulation surface surrounding each set of the connector pins within the connector housing. The continuous conductive layer is intimately bonded to the insulation and is electrically connected to the enclosed pin set. The conductive enclosure or cup acts to intercept the electrons secondarily emitted in the current carrying portion of the pins within the conductive cup and to reapply that charge to the pins thereby preventing unwanted current in the connector pins from connected circuitry. In addition, the connector housing block is fabricated of a liquid crystal thermoplastic which retains its dimensional integrity by retaining the structure of the plastic even at elevated temperatures required for vapor phase soldering, by retaining the crystal structure up to the melting temperature of the plastic material.

The connector housing accommodates spring-loaded pins in through holes supplied in the housing material. The back side of the housing through which the inserted pins extend for connection into, for example, circuit boards are sealed with a high temperature acrylic thermoplastic which provides a completely effective hermetic seal against environmental contaminants such as component coating sprays utilized during final assembly of the connector.

The connector housing is also, on its outer surfaces, patterned within an interconnecting pattern of electrical conductor in order to provide pin to pin contact according to customer desired interconnection schemes.

BRIEF DESCRIPTION OF THE DRAWING

These and other features of the present invention are more fully set forth below in the solely exemplary detailed description and accompanying drawing of which.

DETAILED DESCRIPTION OF THE INVENTION

The present invention contemplates a connector assembly adapted for an application in radiation prone environments to prevent the voltage build up incident to secondary emissions caused by radiation impact on current carrying elements in such environments and in additionally providing a sealed back environment and patterned interconnect with a housing more capable of accepting high temperature treatment such as in vapor phase soldering.

Figure 1A:
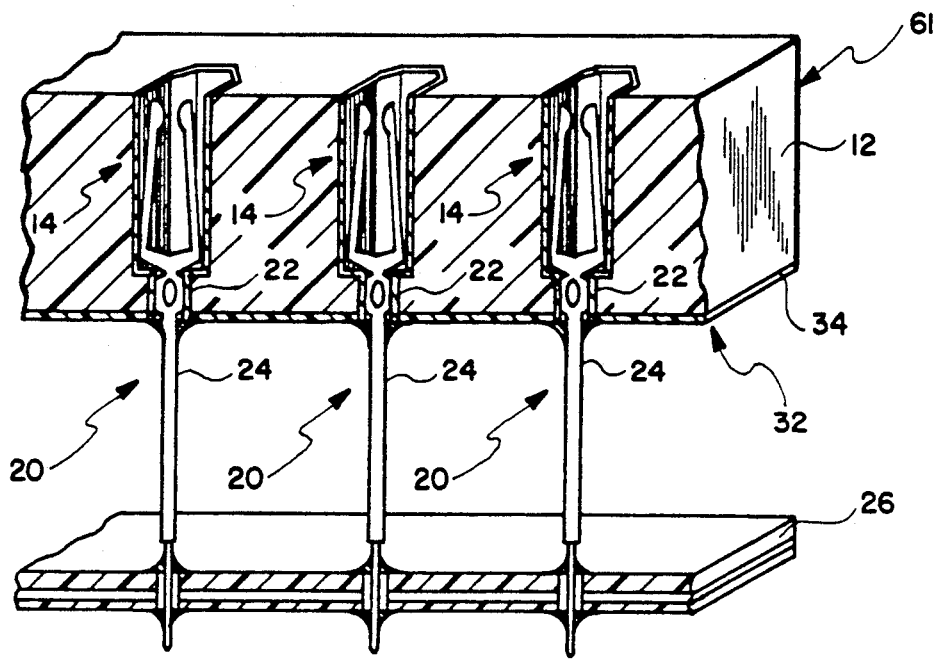
FIG. 1A is a cutaway view of a connector showing connector housing, pins, conductive cup, back seal and exemplary application.

The invention is best illustrated with reference to the drawings and in particular in FIG. 1A, there is shown a cutaway portion 12 of a connector housing or block. The housing or block is typically injection molded of a liquid crystal thermoplastic which has the properties of remaining in the crystal state when the material is heated to the melting condition. Typical examples of such thermoplastics are the VECTRA plastic of Celanese and the ZYDAR plastic of Dartco.

The housing or block is apertured with apertures 14 which comprise an upper portion 16 of expanded size and adapted to receive the bifurcated contacts 18 of a connector pin 20. The apertures 14 include a bottom portion 22 of narrower size which is adapted to permit a shank portion 24 of the pins 20 to pass through after insertion through the opening of the larger aperture 16, leaving contact portion 23 (FIG. 1B) or 25 (FIG. 1C) in aperture 22. The shank portions 24 are adapted to extend for solder engagement with a printed circuit board 26 as one exemplary application, or may be used for wire wrap as desired.

The apertures 14 and 22 are plated with a conductive lining 28 which may be an electrolessly deposited copper layer followed by an electroplated copper layer followed by an electroplated tin or gold layer. The plated linings 28 form a conductive cup around the contacts 18 and collect secondarily emitted electrons from the current carrying pins 20 induced by radiation bombardment, returning them to the circuit through the intimate contact of the pin shank 24 to the aperture 22. This in turn prevents voltage build up of static electricity on surfaces of the housing 12 or elsewhere that would interfere with the signal exchange through the conductor and circuitry of the system of which the conductor is a part. For these purposes, the apertures 22 are dimensioned to provide a snug contact between the lining 28 and the contacts 23 and 25 as shown in the expanded view of the pins in FIGS. 1B and 1C.

The surface 32 of the connector housing or block 12, its back surface through which the shanks 24 pass via the recesses 22, is sealed with a layer 34, typically an acrylic thermo-setting plastic. This layer is applied over the shanks 24 and heated into place to bond to the shanks 24 and the surface 32 providing a complete environmental seal protecting the recesses 22 from environmental contaminants in the vicinity of the circuit board 26, such as a protective coat of Parylene typically applied over the circuit board 26 and pins 24 during system assembly in the context of an inertial navigation system.

Figure 1B:
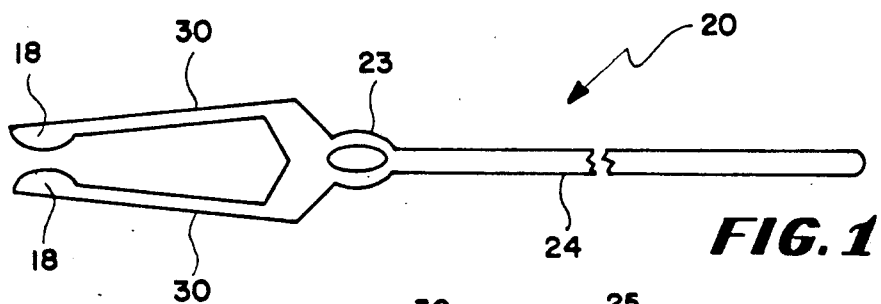
FIGS. 1B and 1C are expanded views of alternative typical connector pins.
Figure 1C:
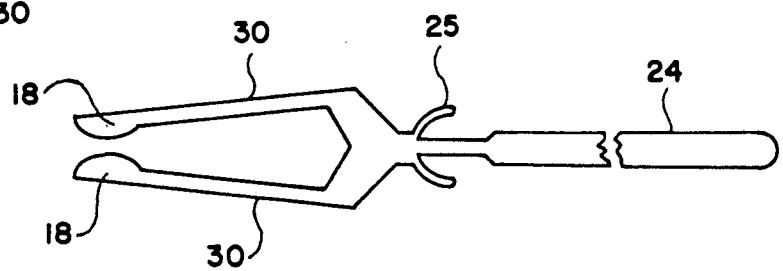

The pins 20 illustrated in FIGS. 1B and 1C are typically one of a set of commercially available compliant pins.

Figure 2A:
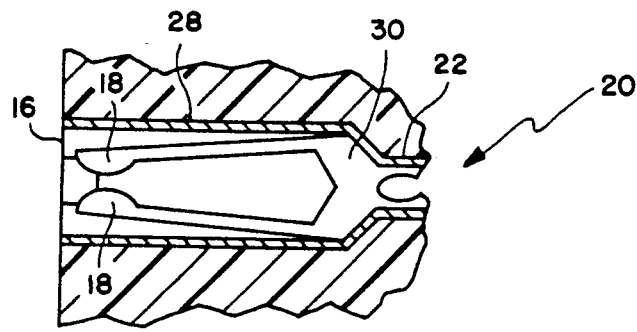
FIGS. 2A-2E illustrate differing forms for the conductive enclosure or cup feature of the present invention.

Other forms for the pin and recess structure are illustrated with respect to FIGS. 2A-2E. As shown in FIG. 2A, the conductive lining 28, which may be gold plated to reduce oxidation potential, has the pin 20 press fit in the lower portions 30 and in the region of the lower aperture 22 in order to provide the electrical contact between the lining 28 and the pin 20 whereby the lining 28 functions as a conductive cup.

Figure 2B:
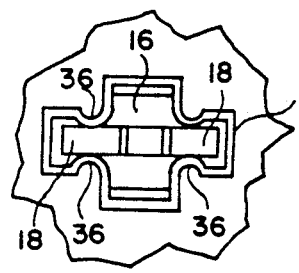
Figure 2C:
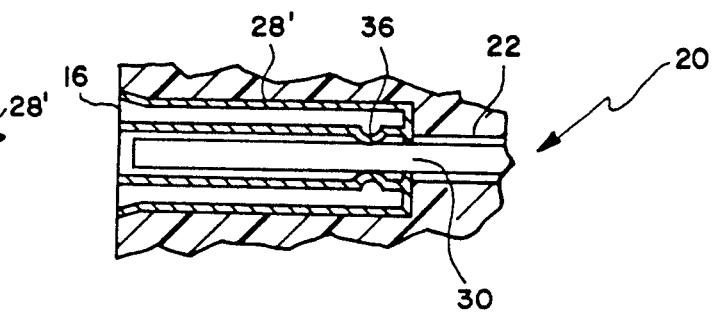
Figure 2D:
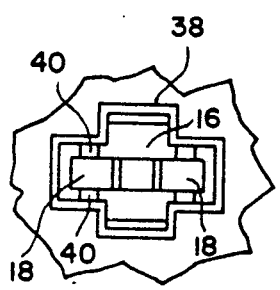
Figure 2E:
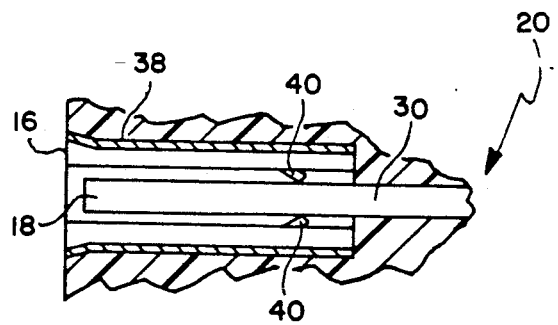
Figure 3:
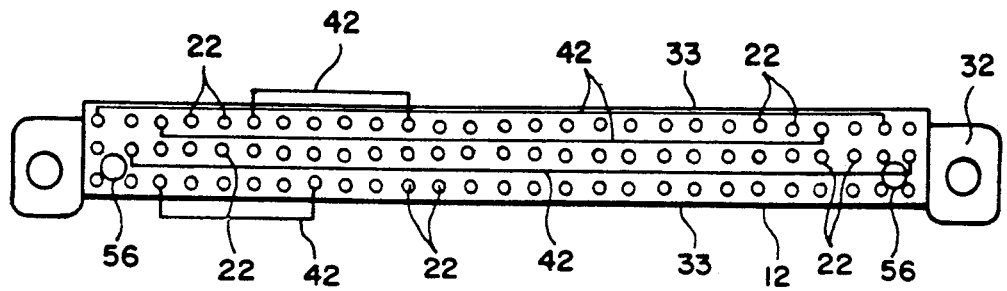
FIG. 3 is a back view of the connector housing of the present invention illustrating an interconnect pattern.

FIGS. 2B and 2C illustrate an alternative version for the recess with a similar pin design in which electrical contact is enhanced by providing a plastic nib 36 within the recess 16 which extends inwardly to more resiliently grip the contacts 18 in the lower region 30. A further modification is illustrated in FIGS. 2D and 2E where the plated lining 28 is replaced with a metal insert 38 bonded into the recess 16 and having a metal tab 40 in the location of the nib 18 to provide a resilient contact between the inserted lining 38 and the pin 20.

The formation of the plated lining 28 can be combined with the formation of a set of interconnect conductors 42 plated onto the under surface 32 or side surfaces 33 of the connector block or housing 12 utilizing printed circuit board plating and through whole plating concepts to provide a copper and/or gold plated nickel pattern of interconnects 42 between the plated apertures 22 in a desired pattern. The pins, after insertion into and through the holes 22, are in contact with interconnects 42 via the linings 28 of the apertures 22 with or without solder.

Figure 4:
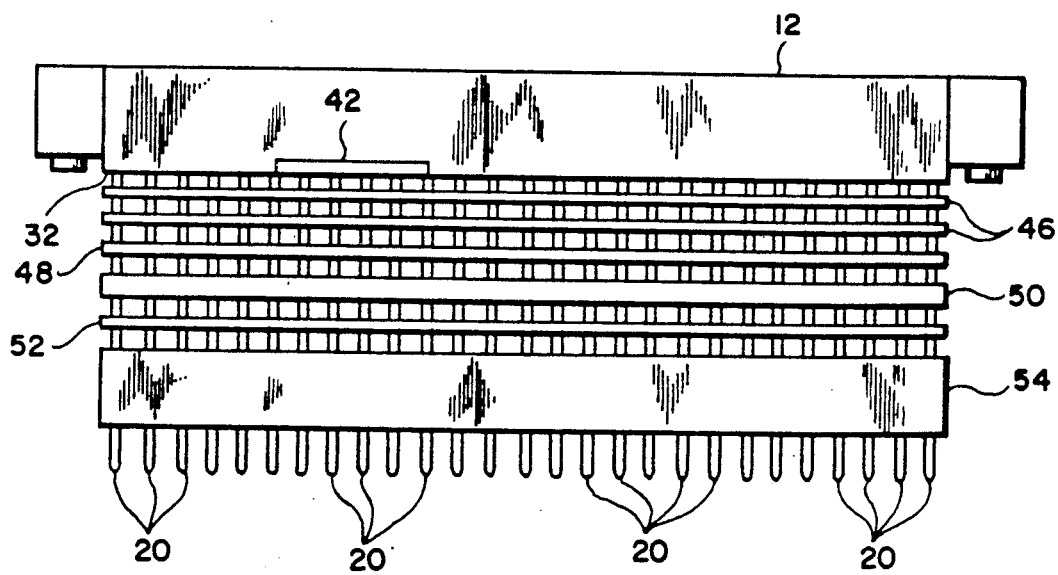
FIG. 4 is a side elevation view of a connector according to the present invention in the process of having the back sealed.

The application of the acrylic layer 34 on the bottom surface 32 of the connector or block 12 is accomplished using a fixture illustrated in FIG. 4. As shown there, a set of layers comprising two layers 46 of an acrylic thermally softening plastic such a Dupont's Pyralux is applied, on surface 33 each layer 46 being four mills in thickness. Thereafter a Tedlar release layer 48 is applied over the pins 20 followed by a silicon rubber pressing layer 50 and a Teflon release layer 52. An apertured metal jig 54 is next applied over the pins and the entire assembly put into a press where it is heated under 70 to 80 psi at 365° F. for one hour to soften the acrylic layers 46 and cause them to bond to the layer 32 as well as the pins 20 and provide an hermetic seal. Registration holes 56 are provided in the bottom surface 32 and layers 46-54 to facilitate the alignment of the various layers and press plate 54.

Figure 5:
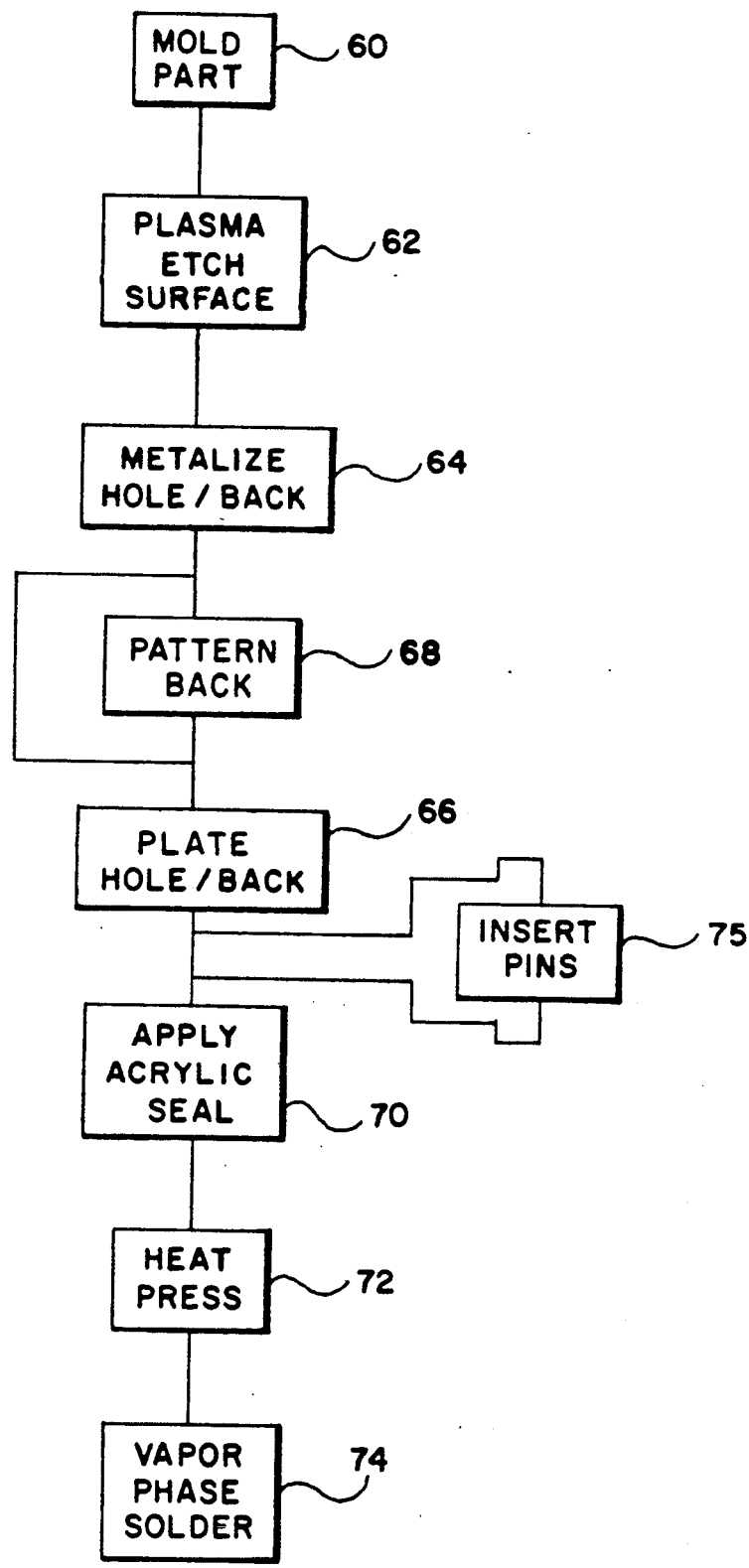
FIG. 5 is an illustration of the steps in the process of manufacture of a connector according to the present invention.

The entire process of manufacture of such a connector as is described and illustrated above can be understood by reference to the flow chart of FIG. 5. In an initial step 60 the housing or block 12 is injection molded of the above-identified plastic. In a subsequent step 62 the surface of the thus molded plastic part is plasma etched, typically in an environment of 70% nitrogen and 30% oxygen in order to facilitate the metalization in step 64. Metalization typically comprises flashing a copper layer over the entire surface of the connector housing or block 12, selectively removing it where it is not necessary to provide conduction for electroplating of a copper layer in a subsequent step 66. Prior to nickel or copper plating in step 66 a pattern of conductors on the back and/or side surfaces 32 and 33 may be layed down using printed circuit board techniques in an optional step 68. In either case, in step 66 copper is electroplated onto the exposed copper flash and a subsequent tarnish resistant tin or gold layer applied as desired. Alternatively, electroless nickel is plated. After step 66, pins 20 are pressed into the block making electrical contact between contacts 23 and 25 and apertures 22. After step 75 the acrylic layer 34 is applied in a step 70 using the layers jig and press illustrated with respect to FIG. 4 to apply an appropriately dimensioned and apertured set of acrylic layers 46. Subsequent step 72 provides the thermo setting of the acrylic layer 34 at the temperatures and pressures illustrated above. Finally in step 74 the thus assembled connector assembly may be soldered into a circuit board 26 according to the ultimately desired application.

As a final step in the assembly of electronic instrumentation in the environment of inertial navigation, the printed circuit board 26 is typically sprayed with a Parylene or other coating for protection. The layer 34 prevents this material from entering the contact area through the apertures 22.

The thus above described embodiments of the invention are intended as exemplary only, the scope of the invention being solely as defined in the following claims.

We claim:

1. A shielded connector assembly comprising:
at least one contacting pin;
a block of insulating connector material including at least one aperture to receive said at least one contacting pin;
a continuous conductive lining substantially disposed in said at least one aperture, said lining forming a conductive cup surrounding a respective at least one contacting pin and shielding said at least one contacting pin substantially within said at least one aperture;
said at least one aperture being dimensioned with respect to said at least one contacting pin so as to make electrical contact between said conductive cup and a respective one of said at least one contacting pin, said contacting pin having a shank portion extending outwardly of a surface of the block and having a contact portion for engaging a mating contact to be inserted into said aperture, said contact portion being substantially fully surrounded by said conductive cup, which forms a radiation shield about said contact portion.

2. The assembly of claim 1 wherein said block includes a liquid crystal thermoplastic.

3. The assembly of claim 2 wherein said thermoplastic is selected from the group comprising VECTRA and ZYDAR.

4. The assembly of claim 1 wherein said block comprises a thermoplastic having the property of retaining a crystalline structure at temperatures wherein said thermoplastic enters the melting state.

5. The assembly of claim 1 wherein said conductive lining comprises at least one of copper and nickel.

6. The assembly of claim 5 wherein said conductive lining includes an electroless deposited copper under an electroplated copper.

7. The assembly of claim 1 wherein each of said at least one contacting pin comprises a bifurcated pin contact and a pin shank with contacts on said pin shank adapted to electrically contact said continuous conductive lining at a narrower lower portion of a respective one of said at least one aperture.

8. The assembly of claim 1 wherein said aperture is dimensioned with respect to said pin to provide electrical contact between pin and plated lining adjacent to said lower portions.

9. The assembly of claim 1 wherein said lining includes protrusions adapted to contact said pin.

10. The assembly of claim 1 wherein:
said block includes a lower face and at least one other face;
said at least one contacting pin is provided in said block extending through a respective one of said at least one aperture at said lower face of said block; and
said lower face includes conductive bands thereon interconnecting selected ones of a plurality of said at least one contacting pin protruding through said lower face.

11. The assembly of claim 10 wherein said conductive bands are included on at least one of said at least one other face.

12. The assembly of claim 10 wherein said conductive bands are electrically connected via said lining to selected ones of said plurality of said at least one contacting pin.

13. The assembly of claim 10 wherein said conductive bands comprise plated conductors.

14. The assembly of claim 1 wherein said block comprises a pattern of conductors on at least one face of said block running between selected ones of a plurality of said at least one aperture.

15. The assembly of claim 1 wherein said block comprises upper and lower faces with said at least one aperture extending through said block between said upper and lower faces;
said at least one contact pin is provided in said at least one aperture extending through said lower face;
a sealing layer is provided over said lower face sealing said at least one contacting pin in said at least one aperture from the environment to which said lower face is exposed.

16. The assembly of claim 15 wherein said seal comprises a thermo setting material.

17. The assembly of claim 16 wherein said said thermo setting material is an acrylic.

18. The assembly of claim 1 wherein said block has a plasma etched surface thereto.

19. The assembly of claim 1 wherein said conductive lining includes a conductive insert applied to said at least one aperture.

* * * * *